United States Patent [19]
Janssen

[11] Patent Number: 5,828,209
[45] Date of Patent: Oct. 27, 1998

[54] VOLTAGE REFERENCE ARRANGEMENT, A VOLTAMETER, A BATTERY VOLTAGE DETECTION ARRANGEMENT, AND A WIRELESS COMMUNICATION DEVICE

[75] Inventor: Daniel J. G. Janssen, Eindhovne, Netherlands

[73] Assignee: U.S Philips Corporation, New York, N.Y.

[21] Appl. No.: 683,479

[22] Filed: Jul. 18, 1996

[30] Foreign Application Priority Data

Jul. 21, 1995 [EP] European Pat. Off. ............. 95202011

[51] Int. Cl.$^6$ .................................................. G05F 1/10
[52] U.S. Cl. ............................................ 323/354; 323/349
[58] Field of Search .................................... 323/299, 313, 323/314, 316, 318, 352, 353, 354, 349

[56] References Cited

U.S. PATENT DOCUMENTS

| | | |
|---|---|---|
| 5,196,782 | 3/1993 | D'Aleo et al. ................ 323/299 X |
| 5,208,842 | 5/1993 | Atwood et al. ................ 323/354 X |
| 5,281,906 | 1/1994 | Thelen, Jr. ....................... 323/313 |
| 5,526,274 | 6/1996 | Bolan et al. ................... 323/354 X |

*Primary Examiner*—Peter S. Wong
*Assistant Examiner*—Y. J. Han

[57] ABSTRACT

A voltage reference arrangement is known for deriving a number of voltages from an input reference voltage. The known arrangement utilizes a rigid resistive voltage divider. A flexible voltage reference arrangement is provided in which inaccuracies in the input reference voltage are eliminated, and a plurality of accurate voltages can be easily derived from an obtained reference voltage. The arrangement comprises a digitally controlled potentiometer having a slider coupled to a multiplexer for multiplexing the slider to an input of a differential amplifier and to outputs. The voltage reference arrangement may be used in a voltmeter and in a battery subtractor in a telephone handset so as to share hardware.

18 Claims, 4 Drawing Sheets

VOLTAGE REFERENCE ARRANGEMENT, A VOLTAMETER, A BATTERY VOLTAGE DETECTION ARRANGEMENT, AND A WIRELESS COMMUNICATION DEVICE

BACKGROUND OF THE INVENTION

The present invention relates to a voltage reference arrangement for providing an accurate output voltage from a relatively inaccurate input reference voltage source, which arrangement comprises a differential amplifier of which a first input is coupled to the input reference voltage source, and of which an output is coupled to a second input of the differential amplifier, the output providing the accurate output voltage.

The present invention further relates to a voltmeter, a battery voltage detection arrangement, and a wireless communication device.

A voltage reference arrangement of the above kind is known from the U.S. Pat. No. 5,281,906. A reference voltage is fed to one input of a differential amplifier of which an output is resistively coupled to another input. Output reference voltages are tapped from the output of the differential amplifier and from junctions of a series arrangement of resistors connected to ground. A feedback resistor of the differential amplifier is part of the series arrangement of resistors. Although such a circuit provides a number of reference voltages, because of its rigid structure, it does not take into account inaccuracies of the input reference voltage source.

SUMMARY OF THE INVENTION

It is an object of the present invention to provide a voltage reference arrangement of the above kind that takes into account inaccuracies of the input voltage reference source, and that has a flexible structure.

To this end the voltage reference arrangement according to the present invention is characterized in that the output is coupled to a supply terminal via a digitally controllable potentiometer of which a programmable slider can be coupled to the second input for adjusting inaccuracies in the input reference voltage source. The invention is based upon the insight that a common use of the slider of the potentiometer is made for both an input voltage adjustment such that inaccuracies in the input reference voltage source can be eliminated in the output voltage of the differential amplifier, and for deriving further accurate output voltage therefrom as the case may be.

In an embodiment of a voltage reference arrangement according to the present invention, the arrangement comprises at least one further output for providing a further accurate output voltage derivable from the output voltage of the differential amplifier, and a digitally controllable multiplexer for multiplexing the slider to the second input and to the at least one further output. Herewith, any number of desired accurate output voltages can be derived from the output voltage of the differential amplifier, once adjusted.

Further embodiments are claimed in the dependent claims. Advantageously, a feedback element of the differential amplifier is a capacitor, as well as elements coupled to outputs of the multiplexer so as to provide the further accurate voltages. Herewith, adjustment and multiplexing can easily be done by means of software loaded in a digital controller. Then, at choice, some outputs can be adjusted once the input reference voltage source, such as a bandgap-reference source, is coupled to the differential amplifier, and corrected slider values can be stored in a non-volatile memory, and other outputs can be adjusted later on, preferably dynamically on the basis of some other external parameter. Such a later adjustment can advantageously be done when the voltage reference arrangement is part of a wireless digital communication device such as a cordless telephone in which at least some of the operational voltages will have to be determined dynamically, such as a tuning voltage, a control voltage for determining the modulation depth, or the like. Because of its flexibility, the voltage reference arrangement can also be advantageously be integrated in a voltmeter, and a battery voltage detection arrangement within the wireless digital communication device. The present invention thus provides a maximum of flexibility of the voltage reference arrangement with a multiplexing of functions. In particular, in a device like a wireless digital communication device such multiplexing of functions leads to a reduced chip area when implementing the invention into an integrated circuit so that the tendency to miniaturize wireless devices can be fulfilled more easily.

BRIEF DESCRIPTION OF THE DRAWING

The present invention will now be described, by way of example, with reference to the accompanying drawings, wherein FIG. 1 schematically shows a wireless digital communication system.

Throughout the figures the same reference numerals are used for the same features.

DESCRIPTION OF THE PREFERRED EMBODIMENTS

Figure 1:
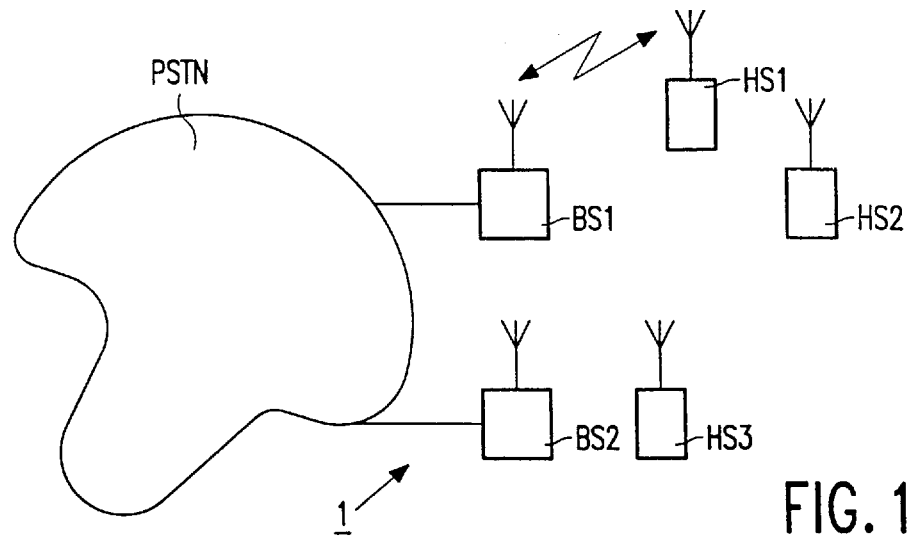

FIG. 1 schematically shows a wireless digital communication system 1, in the given example a digital cordless telephony system in accordance with the DECT Standard (Digital European Cordless Communications) as standardized by ETSI (European Telecommunications Standards Institute). The system 1 comprises radio base stations BS1 and BS2 coupled to the public switched telephone network PSTN. Further shown are cordless handsets HS1, HS2, and HS3 which are arranged for bi-directional communication with the base stations to which they are authorized to communicate. Although the cordless system is shown in its simplest form, more elaborate systems concepts are possible, such as combinations with PABXs (Private Automatic Branch Exchange) with cordless extensions, Telepoint stations, forming of microcells with roaming, or the like. The present invention may be placed in a transceiver of such a system, but may also be included into any other suitable device or system.

Figure 2:
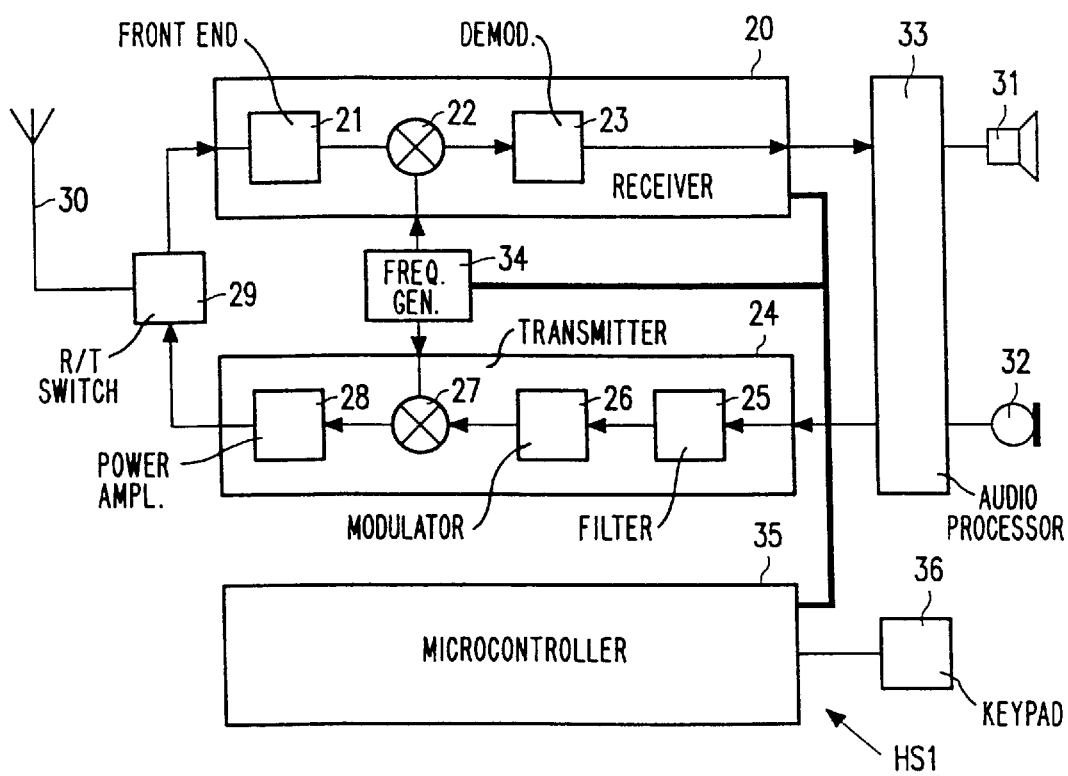
FIG. 2 shows a block diagram of a wireless digital communication device for use in a wireless digital communication system.

FIG. 2 shows a block diagram of the wireless digital communication device HS1, e.g. a DECT cordless handset, which comprises a receiver 20 having a receiver front-end 21, a mixer 22, and a demodulator 23. The device HS1 further comprises a transmitter 24 having a pulse shaping filter 25, a modulator 26, a mixer 27, and a transmit power amplifier 28. At the RF-side, the receiver 20 and the transmitter 24 are coupled to a receive/transmit switch 29 which is coupled to an antenna 30. At the LF-side, the receiver 20 and the transmitter 24 are coupled to a telephone receiver or loudspeaker 31 and a microphone 32 via an audio processor 33. For tuning to a desired radio channel, the handset HS1 comprises a controllable frequency source 34. The handset HS1 is controlled by a microcontroller 35 which is coupled to the receiver 20, to the transmitter 24, to the controllable frequency source, and further to a keypad 36 for user control of the handset HS1. The microcontroller 35 comprises RAM, and ROM and other non-volatile memory (not shown) for executing stored programs, for storing predetermined data, and for storing temporary data. As far as the radio parts are concerned, the base station BS1 has a similar architecture.

Figure 3:
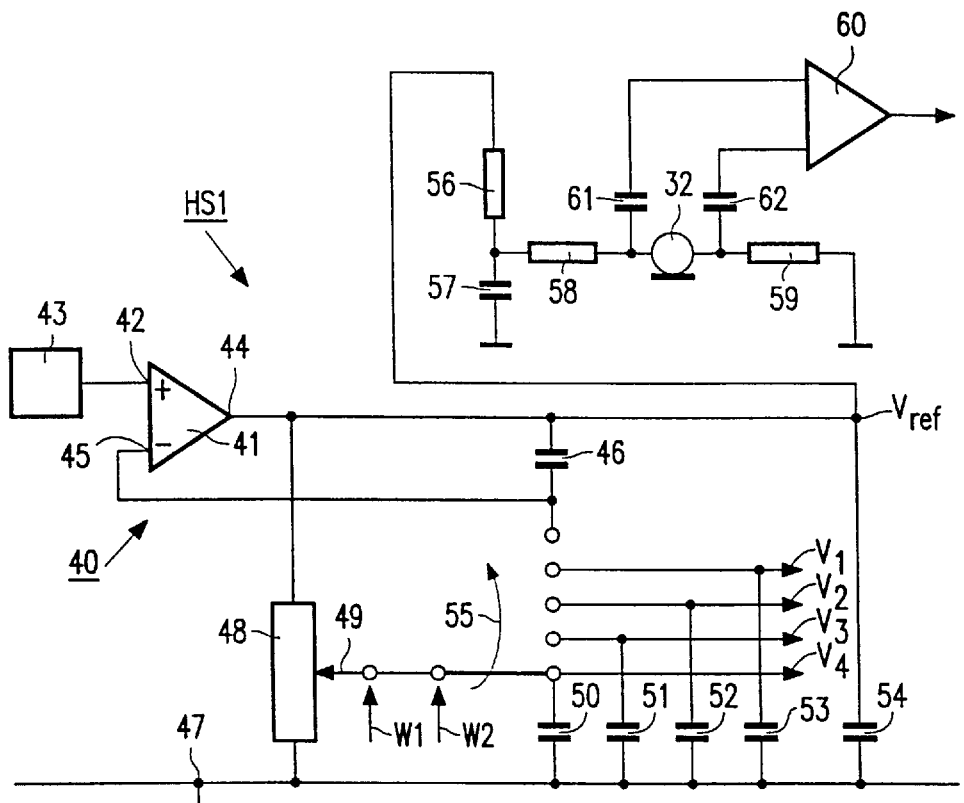
FIG. 3 shows a block diagram of a voltage reference arrangement according to the present invention.

FIG. 3 shows a block diagram of a voltage reference arrangement 40 according to the present invention for providing an accurate output voltage $V_{ref}$. The arrangement 40 comprises a differential amplifier 41 of which a first input 42 is coupled to a relatively inaccurate input reference voltage source 43 that can be a so-called bandgap reference circuit, such as in a incorporated within the integrated circuit type PCD5032. Such a bandgap reference typically has an exemplary spread of 5%. An output 44 of the differential amplifier 42 is coupled to a second input 45 of the differential amplifier 41 via a first capacitor 46, and is further coupled to a supply terminal 47 via a digitally controllable potentiometer 48 of which a slider 49 is controllable by means of a digital word W1. After coupling of the bandgap reference 43 to the voltage reference arrangement 40, inaccuracies in the input voltage reference source can be adjusted such that the output voltage $V_{ref}$ has a desired value, e.g. 2 volt when using the output voltage $V_{ref}$ for feeding the microphone 32. An adjustment value can be stored in a non-volatile memory included in the microcontroller 35. According to the present invention, the arrangement 40 can provide further accurate output voltages $V_1$, $V_2$, $V_3$, and $V_4$ from the same digital potentiometer 48. These voltages can be determined after coupling of the bandgap reference 43 to the voltage reference arrangement 40, or, afterwards, dynamically, e.g. from a parameter in the handset HS1 which can be subject to thermal variations such as a tuning voltage. The voltages $V_1$, $V_2$, $V_3$, and $V_4$ are generated across respective capacitors 50, 51, 52, and 53 by digitally controlling a multiplexer 55 by means of a digital word W2, whereas the voltage $V_{ref}$ is generated across a capacitor 54. The reference voltage $V_{ref}$ is coupled to the microphone 32 via a network comprising a resistor 56, a capacitor 57, and a resistor 58, the microphone 32 further being coupled to ground via a resistor 59. The microphone voltage is fed to an amplifier 60 via capacitors 61 and 62. According to the present invention, the slider 49 is thus used for both input and output voltages.

Figure 4:
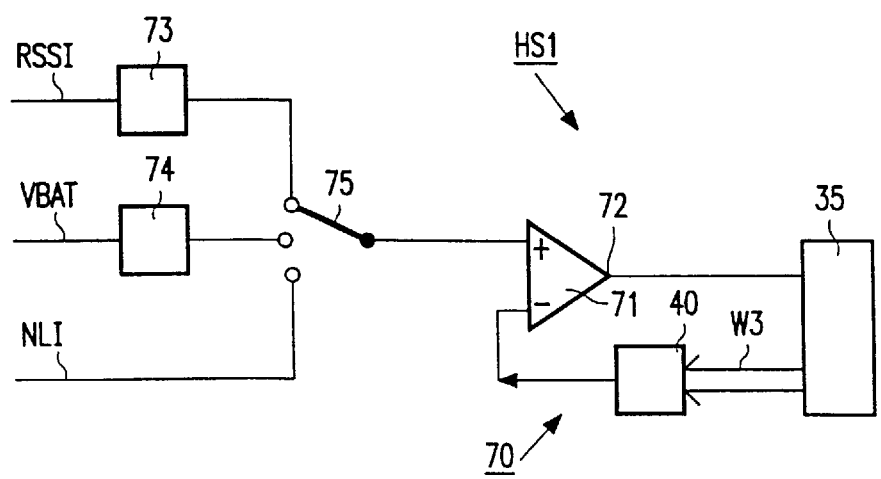
FIG. 4 shows a voltmeter comprising a voltage reference arrangement according to the present invention.

FIG. 4 shows a voltmeter 70 comprising a voltage reference arrangement 40 according to the present invention. At the output side, the arrangement 40 is coupled to a comparator 71, and at the input side, the arrangement 40 is coupled to the controller 35. An output 72 of the comparator 71 is fed to the controller 35. Herewith, a voltmeter is obtained partly using the same hardware as the voltage reference arrangement 40. The voltage reference arrangement thus has a multiple use. E.g. in the handset HS1, the voltmeter 70 can be used for measuring an RSSI-voltage (Received Signal Strength Indicator) measured by means of a peak detector 73, or can be used for measuring a battery voltage VBAT supplied by a battery voltage detection arrangement 74, or for measuring any signal NLI with a range of 2000 mV, the latter being useful when an extra pin on the integrated circuit in which the arrangement is embodied is available. These voltages are measured in different operating phases of the handset HS1 such that use of the voltmeter can be made on a time-sharing basis so as to save hardware. To this end, a further multiplexer 75 is provided. The operation of the voltmeter can be done by means of software loaded into the controller 35. The software can simply apply successive approximation, i.e. a digital word W3 can be chosen such that the comparator input voltage is successively halved, the output 72 of the comparator 71 indicating to the controller 35 in which direction the difference between the input voltage to the comparator from the arrangement 40 and the input to the comparator from the voltage to be measured moves. Herewith, the voltage to be measured is determined quickly.

Figure 5:
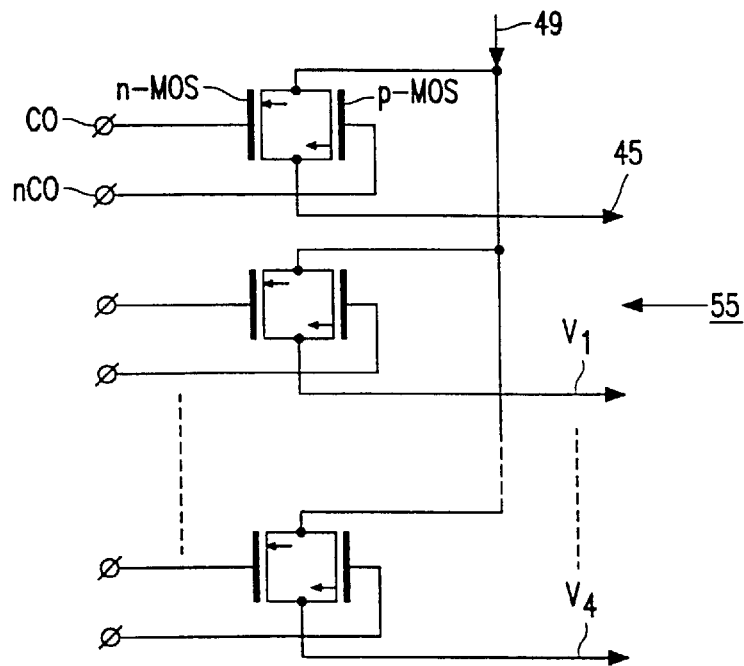
FIG. 5 shows a digitally controllable multiplexer in a voltage reference arrangement according to the present invention.

FIG. 5 shows the digitally controllable multiplexer 55 in the voltage reference arrangement 40 according to the present invention. The multiplexer 55 comprises a plurality of complementary MOS-transistor switches formed by a p-MOS transistor and an n-MOS transistor, controlled by an inverted binary, control signal nC0 and a corresponding binary signal C0. Shown are switches for coupling the slider 49 to the input 45 of the differential amplifier 41, and for coupling the slider 49 to the outputs $V_1, \ldots, V_4$.

Figure 6:
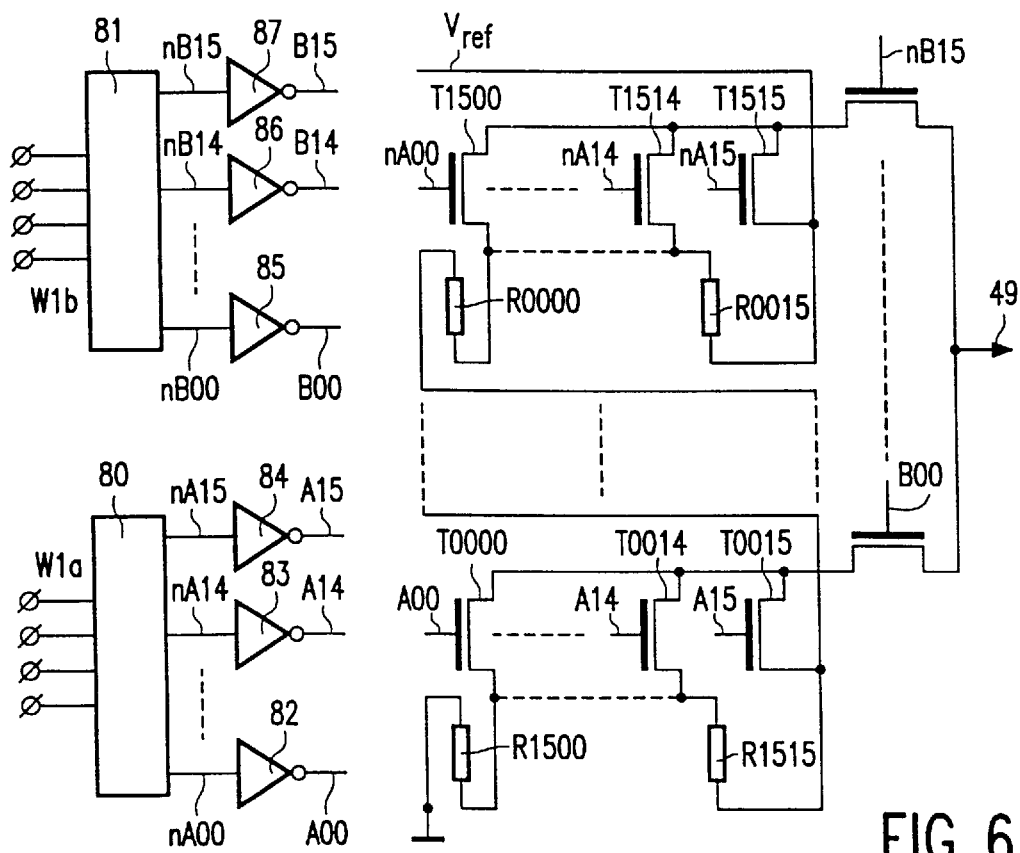
FIG. 6 shows a digitally controllable potentiometer in a voltage reference arrangement according to the present invention.

FIG. 6 shows the digitally controllable potentiometer 48 in the voltage reference arrangement 40 according to the present invention. The potentiometer 48 comprises an array of 16×16 MOS-transistors=256 MOS-transistors. Shown are transistors T000, ..., T0014, T0015 of the first row of the array, and transistors T1500, ..., T1514, T1515 of the sixteenth row of the array. All drains of transistors in a row are connected to each other, and the sources of the row transistors are linked to each other via resistors throughout the array. Shown are resistors R0015, R0000, R1500, and R1515. A column of MOS-transistors is coupled to the drains of the respective rows. For a proper operation of the array, the top three rows are operated by control signals nA00, ..., nA14, nA15, and the corresponding column transistors by the control signals nB15, nB14, and nB13, respectively. The other rows are controlled by control signals A00, ..., A14, A15, and the corresponding column transistors by the control signals B12, B11, ..., B00. Three additional rows of transistors are connected parallel to the sources of rows B12, B11, and B10, corresponding additional column transistors being controlled by control signals nB12, nB11, and nB10. The control signals A00, ..., A14, A15, nA00, ..., nA14, nA15, B00, ..., B14, B15, and nB00, ..., B14, B15 are generated from nibbles W1$a$ and W1$b$ of the digital word W1 by means of respective one-out-of-sixteen-decoders 80 and 81. Inverted and non-inverted control signals are available at input and output sides of respective inverters. Shown are inverters 82, 83, 84, 85, 86, and 87. With a reference voltage of 2000 mV, the resolution of the potentiometer 48 is 2000/256 mV=7.8125 mV.

Figure 7:
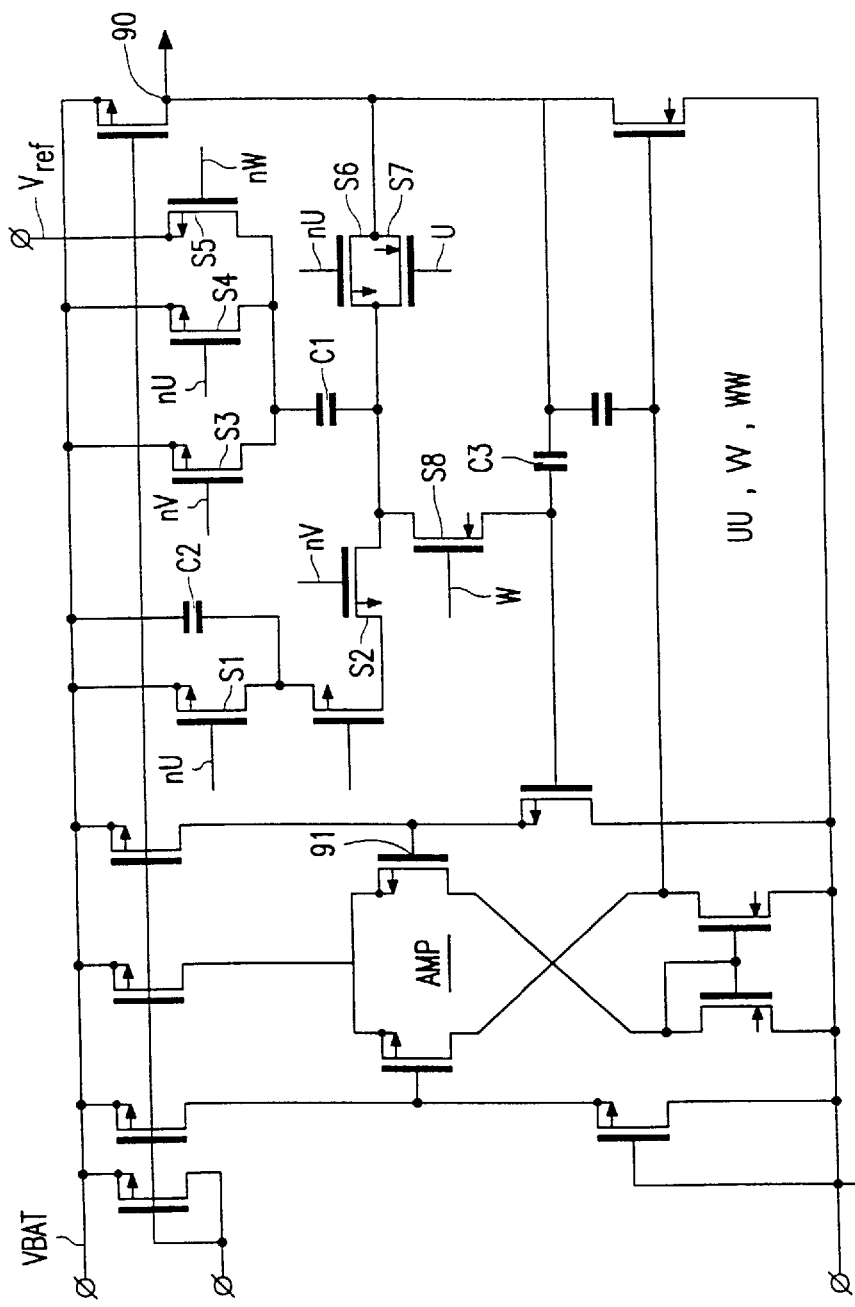
FIG. 7 shows a battery voltage detection arrangement according to the resent invention using a voltmeter according to the present invention.

FIG. 7 shows the battery voltage detection arrangement 74 according to the present invention using the voltmeter 70 according to the present invention. Use is made of the voltmeter 70 having a limited measuring range, in the given example from 0–2000 mV. The handset HS1 typically applies three NiCad battery cells in series having a total nominal voltage of 3.6 V, a total battery loading voltage then being 4.2 V. A cell-characteristic of NiCad cells is that after a period of use the cell voltage suddenly drops. This is particularly true when the handset HS1 is in a transmit mode. Furthermore, under practical circumstances, one of the cells deteriorates earlier than other cells do. It is thus of great importance that during a transmit mode of the handset HS1 the total battery voltage can be measured with a great resolution at relatively small periods of time. It is to be realized that it is not important to measure the absolute value of the battery voltage, but that the battery voltage must be measured with a great resolution. The battery voltage detection arrangement 74, in combination with the voltmeter 70, is suitable for carrying out such measurements. The battery voltage arrangement operates in three phases UU, VV, and WW, indicated with digital control signals nU, U, nV, nW, and W which are generated by the controller 35. The battery voltage detection arrangement 74 subtracts the accurate reference voltage $V_{ref}$ as generated by the voltage reference arrangement 40 from the battery voltage VBAT, and does so in the three phases U, V, W. To this end, the battery voltage detection arrangement comprises a MOS-FET buffer amplifier AMP, three capacitors $C_1$, $C_2$, and $C_3$, and a plurality of MOS-switches S1, S2, S3, S4, S5, S6, S7, and S8 controlled by out of the set of the digital control signals nU, U, nV, nW, and W in the respective phases UU, VV, and WW. In the phase UU, the capacitor $C_1$ is connected between the voltage VBAT and an output 90 of the amplifier AMP by appropriately switching the switches S4, S6, and S7 with the control signals nU, nU, and U respectively. In the phase UU, the capacitor $C_2$ is short-circuited by means of the switch S1 controlled by the control signal nU. In the next phase, the phase VV, the capacitors $C_1$ and $C_2$ are switched parallel to each other by the switch path $C_2$, S2, $C_1$, and $S_3$. In the last phase, the phase WW, the capacitor $C_1$ is switched between the reference voltage $V_{ref}$ and an input 91 of the amplifier AMP, by means of the switches S5 and S8. By applying Kirchoff's laws it can easily be shown that after a number of quick repetitions of the phase UU, VV, and WW, the output 90 of the amplifier AMP converges to the voltage $\{VBAT-V_{ref}(C_1+C_2)/C_1\}$, or, if $C_2=0$, $\{VBAT-V_{ref}\}$.

I claim:

1. A voltage reference arrangement for providing an accurate output voltage from a relatively inaccurate input reference voltage source, wherein the arrangement comprises a differential amplifier having a first input coupled to the input reference voltage source, and an output coupled to a second input of the differential amplifier, the output providing the accurate output voltage, characterized in that the output is coupled to a supply terminal via a digitally controllable potentiometer of which a programmable slider can be coupled to the second input for adjusting inaccuracies in the input reference voltage source.

2. A voltage reference arrangement according to claim 1, wherein the output is coupled to the second input via a first capacitor, and the slider is connected to the second input.

3. The voltage reference arrangement according to claim 2 comprising at least one further output for providing a further accurate output voltage derived from the output voltage of the differential amplifier, and a digitally controllably multiplexer for multiplexing the slider to the second input and to the at least one further output.

4. The voltage reference arrangement according to claim 3 wherein the further output is coupled to the supply terminal via a second capacitor.

5. A voltage reference arrangement according to claim 1, comprising at least one further output for providing a further accurate output voltage derivable from the output voltage of the differential amplifier, and a digitally controllable multiplexer for multiplexing the slider to the second input and to the at least one further output.

6. A voltage reference arrangement according to claim 3, wherein the further output is coupled to the supply terminal via a capacitor.

7. A voltage reference arrangement according to claim 5, comprising a non-volatile memory for storing adjustment values for the programmable slider for predetermined values of at least one output.

8. A voltage reference arrangement according to claim 7, wherein the output value of at least one output is determined from a parameter during operation of the arrangement, and the non-volatile memory is updated accordingly at predetermined points of time.

9. The voltage reference arrangement according to claim 1 wherein the output of the differential amplifier is coupled to the second input thereof via a current path exclusive of said potentiometer.

10. The voltage reference arrangement according to claim 1 wherein the output of the differential amplifier and the second input of the differential amplifier are coupled to the supply terminal via the programmable slider of the digitally controllable potentiometer.

11. A voltmeter comprising:
   a voltage reference circuit including a differential amplifier having a first input coupled to an input reference voltage source, an output providing an accurate output voltage and coupled to a second input of the differential amplifier, wherein said output is coupled to a supply voltage terminal via a digitally controllable potentiometer having a programmable slider coupled to the second input for adjusting inaccuracies in the input reference voltage source,
   a comparator having first and second inputs and an output,
   measurement logic,
   first means coupling an input of the voltmeter to the first input of the comparator, and
   second means coupling the voltage reference circuit between the measurement logic and the second input of the comparator, whereby under control of the measurement logic the voltage reference circuit is controlled until an output value at the output of the comparator indicates that a voltage measurement is terminated.

12. A battery voltage detection arrangement comprising a voltmeter which has a lower range than the battery voltage and comprises;
   a voltage reference circuit including a differential amplifier having a first input coupled to an input reference voltage source, an output providing an accurate output voltage and coupled to a second input of the differential amplifier, wherein said output in coupled to a supply voltage terminal via a digitally controllable potentiometer having a programmable slider coupled to the second input for adjusting inaccuracies in the input reference voltage source,
   a comparator having first and second inputs and an output,
   measurement logic,
   first means coupling an input of the voltmeter to the first input of the comparator, and
   second means coupling the voltage reference circuit between the measurement logic and the second input of the comparator, whereby under control of the measurement logic the voltage reference circuit is controlled until an output value at the output of the comparator indicates that a voltage measurement is terminated, and the battery voltage detection circuit further comprises;

an operational amplifier with a feedback capacitor, at least one further capacitor, and capacitor switching means for switching the at least one further capacitor, an output of the detection arrangement being coupled to the voltmeter, whereby the switching means successively couple a first capacitor between an output of the operational amplifier and a supply voltage, and between an input of the operational amplifier and the accurate output voltage.

13. A battery voltage detection arrangement according to claim 12, comprising a second capacitor which is short-circuited when coupling the first capacitor between the output of the operational amplifier and the supply voltage, and which is switched parallel to the first capacitor before coupling the first capacitor between the input of the operational amplifier and the accurate output voltage.

14. A wireless digital communication device comprising at least one of the following, a voltage reference arrangement according to claim 1, a voltmeter according to claim 11, and a battery voltage detection arrangement according to claim 12.

15. A voltage reference circuit comprising:

a differential amplifier having a first input coupled to an input reference voltage source, and an output coupled to a supply voltage terminal via a digitally controllable potentiometer and to a second input of the differential amplifier, the output providing an accurate output voltage, first means coupling the output of the differential amplifier to the supply voltage terminal via a slider of the digitally controllable potentiometer, and second means coupling the slider of the potentiometer to the second input of the differential amplifier for adjusting inaccuracies in the input reference voltage source.

16. The reference voltage circuit as claimed in claim 15 comprising at least one further output for providing a further accurate output voltage derived from the output voltage of the differential amplifier, and the second coupling means comprises switching means for switching the slider to the second input of the differential amplifier and to the at least one further output.

17. The reference voltage circuit as claimed in claim 15 wherein the slider is directly connected to the second input of the differential amplifier and the output of the differential amplifier is coupled to the second input of the differential amplifier via a capacitor.

18. The reference voltage circuit as claimed in claim 15 further comprising an output terminal of the reference voltage circuit coupled to the output of the differential amplifier via a current path independent of the potentiometer slider.

* * * * *